United States Patent [19]

Takeuchi

[11] Patent Number: 4,912,717
[45] Date of Patent: Mar. 27, 1990

[54] APPARATUS FOR CONTROLLING THE AMOUNT OF LASER LIGHT AND LASER LIGHT MONITORING METHOD

[75] Inventor: Ryoji Takeuchi, Yokohama, Japan

[73] Assignee: Kabushiki Kaisha Toshiba, Kawasaki, Japan

[21] Appl. No.: 277,177

[22] Filed: Nov. 29, 1988

[30] Foreign Application Priority Data

Nov. 30, 1987 [JP] Japan .................. 62-302626

[51] Int. Cl.[4] ............................................. H01S 3/00
[52] U.S. Cl. ........................................ 372/38; 372/33
[58] Field of Search ..................... 372/31, 29, 38, 32, 372/33

[56] References Cited

U.S. PATENT DOCUMENTS 4,237,427 12/1980 Holland .................................. 372/29
4,516,242 5/1985 Yokota ................................... 372/29

FOREIGN PATENT DOCUMENTS 0298938 12/1987 Japan ..................................... 372/31

*Primary Examiner*—Frank Gonzalez
*Attorney, Agent, or Firm*—Finnegan, Henderson, Farabow, Garrett and Dunner

[57] ABSTRACT

An apparatus for adjusting the amount of laser light includes a laser light generator for generating laser light, and a detector for detecting the amount of the laser light so as to generate an output signal corresponding to the amount of the laser light. The apparatus further includes a first adjuster for adjusting the amplitude of the output signal and a second adjuster for adjusting the amount of the laser light generated by the laser light generator. The adjustment of the amplitude of the output signal and the adjustment of the amount of the laser light are performed separately through a selector.

15 Claims, 3 Drawing Sheets

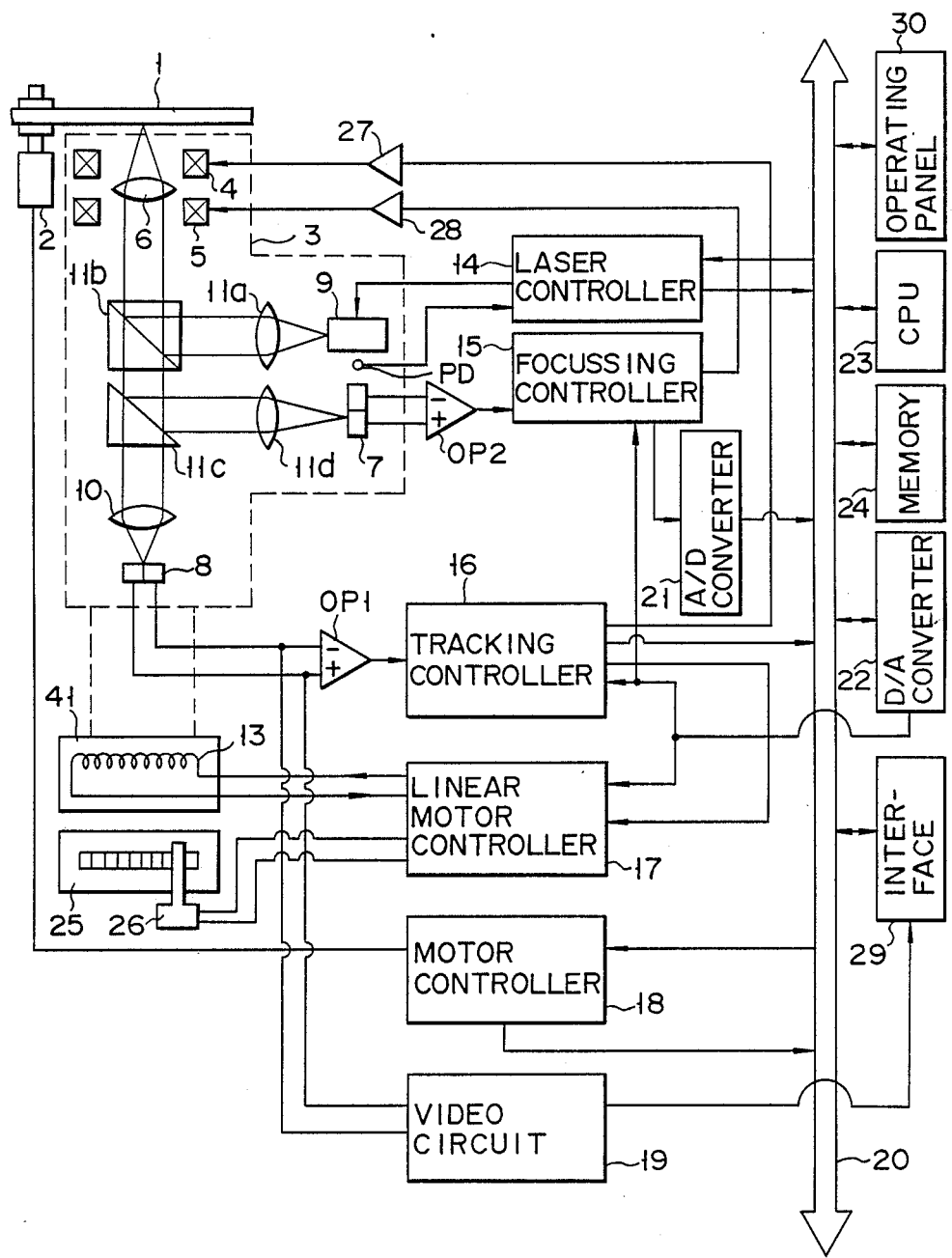
F I G. 1

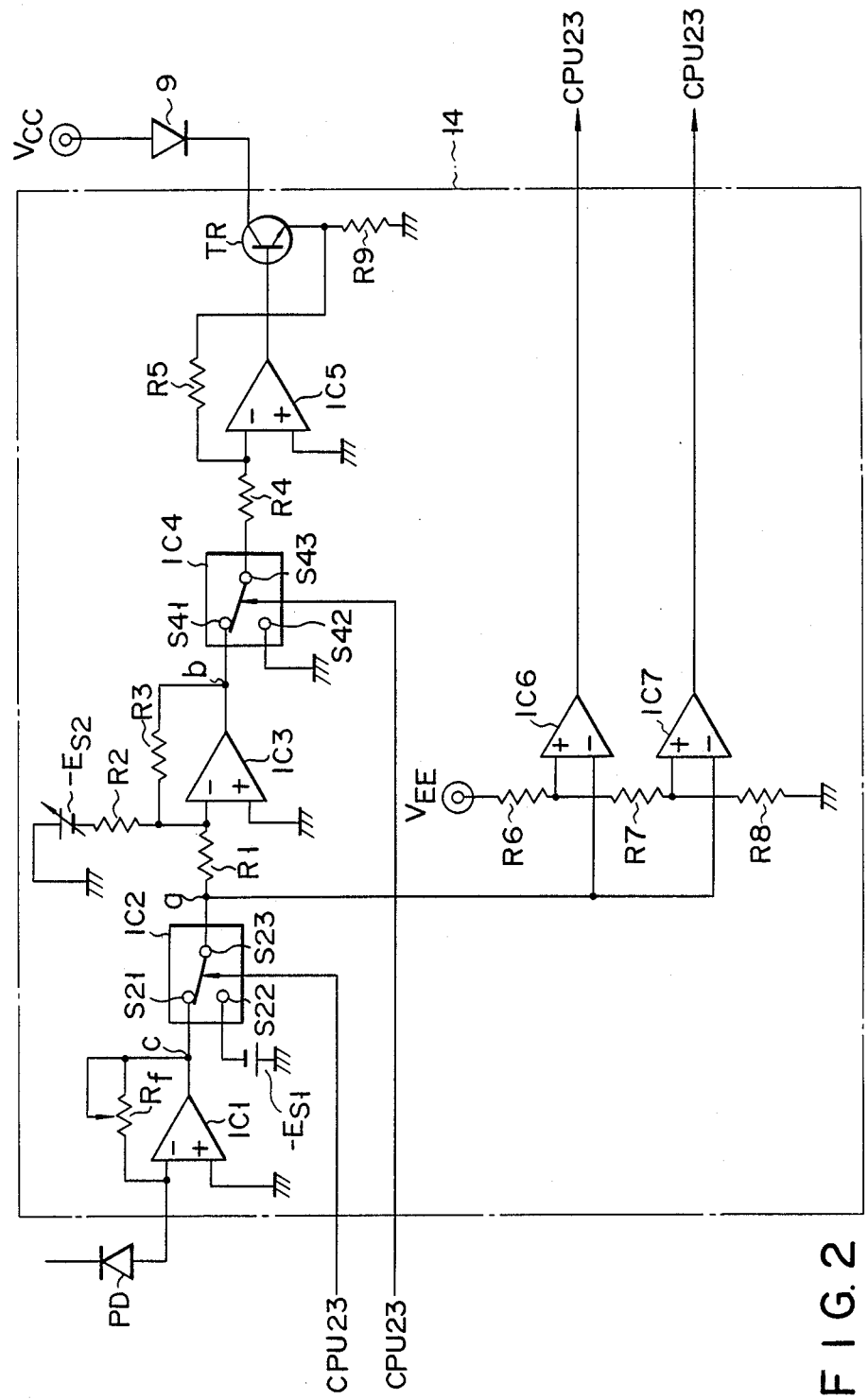
F I G. 2

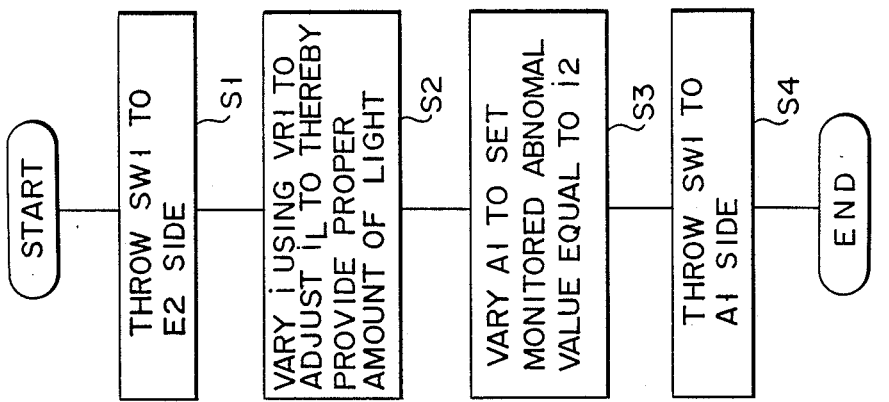
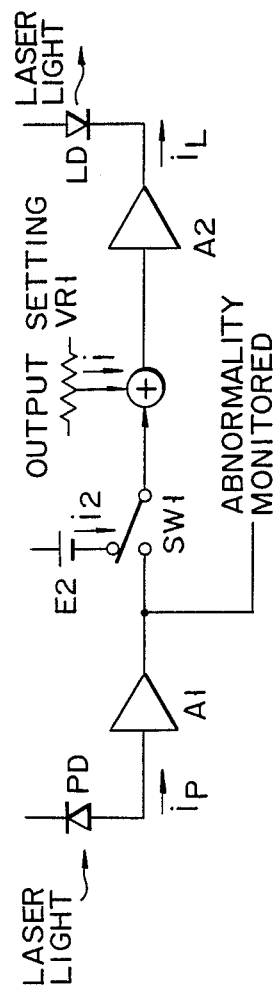
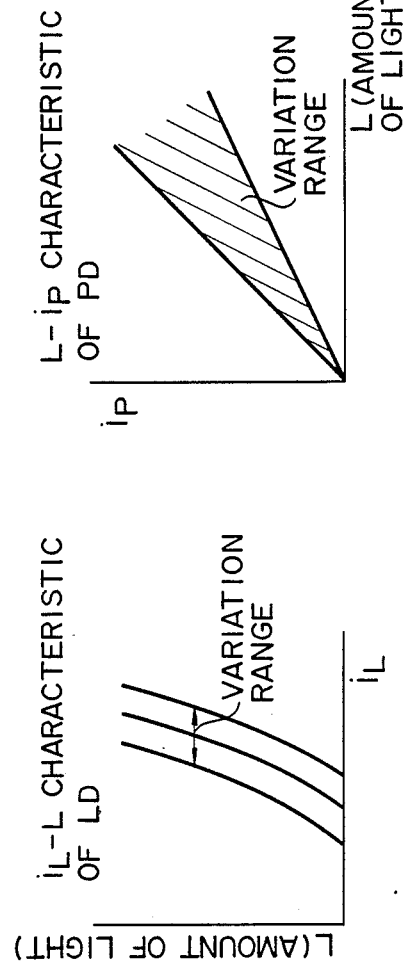

APPARATUS FOR CONTROLLING THE AMOUNT OF LASER LIGHT AND LASER LIGHT MONITORING METHOD

BACKGROUND OF THE INVENTION

1. Field of the Invention

The present invention relates to a laser controller and, more particularly, to a laser light amount controller which can adjust the amount of light from a light source used in a recording apparatus, independently of the detection output of a light detector and to a laser light monitoring method.

2. Description of the Related Art

A data recording apparatus for recording data by irradiating light on a recording medium uses, for example, a semiconductor laser as a light source. Normally, a light receiving element (photodiode) receives the output of the semiconductor laser so as to detect the amount of light from the semiconductor laser. A laser controller controls the output of the semiconductor laser in accordance with the detected amount of light in order to keep the amount of light from the semiconductor laser constant.

It is known that semiconductor lasers and light receiving elements generally have a variation in operational point, the level of the maximum point being three to five times greater than that of the minimum point. To cope with this problem, a laser controller is provided with a variable power source for varying the operational point to provide the proper laser output. Such a laser controller is described in U.S. Pat. No. 4,516,242.

From the view point of circuit design, however, such a variable power source cannot independently adjust the variation in output of the light receiving element and the variation in output of the semiconductor laser. In other words, varying the output of the light receiving element changes the threshold value of the laser light accordingly. Naturally, an adjusted output of the light receiving element does not necessarily correspond to the output of the semiconductor laser.

The laser controller generally has a circuit for generating a ready signal that indicates the irradiation of laser light and a circuit for generating an alarm signal that indicates abnormal irradiation of laser light. Since the output of the light receiving element does not necessarily correspond to the output of the semiconductor laser, the alarm signal may be generated even when the irradiation of laser light is not abnormal, or, in some cases, when abnormal irradiation of laser light occurs, it is not correctly transferred to the light receiving element. In the latter case, no alarm signal would be generated and the abnormal irradiation cannot be stopped, which may damage a recording film on a recording medium.

SUMMARY OF THE INVENTION

Accordingly, it is an object of this invention to provide a laser controller which independently adjusts the threshold value of light from a light source and a detection output of a light amount detecting element, thereby improving the reliability of a ready signal and an alarm signal, and to provide a laser light monitoring method.

To achieve the object, there is provided an apparatus for adjusting the amount of laser light comprising means for generating laser light, means for detecting an amount of the laser light generated by the generating means so as to generate an output signal corresponding to the amount of the laser light, first adjusting means for adjusting an amplitude of the output signal generated by the detecting means, second adjusting means for adjusting the amount of the laser light generated by the generating means, and means, responsive to the first adjusting means and the second adjusting means, for performing separately the adjustment of the amplitude of the output signal generated by the detecting means and the adjustment of the amount of the laser light generated by the generating means.

BRIEF DESCRIPTION OF THE DRAWINGS

The foregoing aspects and other features of the invention will be explained in the following description taken in conjunction with the accompanying drawings wherein:

FIG. 1 is a diagram illustrating a data recording apparatus to which a laser controller embodying this invention is applied;

FIG. 2 is a schematic circuit diagram of the laser controller of this invention;

FIG. 3 illustrates the essential section of the circuit shown in FIG. 2;

FIGS. 4A and 4B are diagrams showing $i_L$-L characteristic of LD and L-$i_P$ characteristic of PD, respectively; and FIG. 5 is a flowchart showing how the amount of laser light is adjusted.

DETAILED DESCRIPTION OF THE PREFERRED EMBODIMENTS

An embodiment of this invention will be described below with reference to the accompanying drawings.

FIG. 1 is a block diagram of an optical disk device to which a laser controller of this invention is applied.

An optical disk 1 is rotatable by a DC motor 2 which is controlled by a motor controller 18. An optical pickup 3 is provided along optical disk 1 to pick up data from optical disk 1. Optical pickup 3 is provided with a position detector 26 so that as optical pickup 3 moves in the radial direction of optical disk 1, position detector 26 moves in the same direction by the same distance. An optical scale 25 is secured adjacent to position detector 26, which is coupled to linear motor controller 17. Position detector 26 produces an electric signal representing the distance position detector 26 is moved and sends the signal to linear motor controller 17. In accordance with the received signal, linear motor controller 17 controls a linear motor 41 which comprises a fixed section and a movable section. The fixed section of linear motor 41 includes a permanent magnet (not shown), and the movable section includes a drive coil 13. Motor 41 moves optical pickup 3 in the radial direction of optical disk 1 under the control of linear motor controller 17.

Optical pickup 3 comprises drive coils 4 and 5, and an objective lens 6. Objective lens 6, which is supported by a wire spring (not shown), is moved, by drive coil 5, in its axial direction (the focussing direction) and it is moved, by drive coil 4, in the direction perpendicular to the focussing direction (the tracking direction).

Optical pickup 3 further comprises a semiconductor laser 9, photosensors 7 and 8, a focussing lens 10, a collimator lens 11a, a beam splitter 11b, a half prism 11c, and a focussing lens 11d. Semiconductor laser 9 is driven by a laser controller 14 provided outside optical pickup 3. At the proximity of semiconductor laser 9 is provided a light receiving element PD (a didode for monitoring laser light) which detects the amount of light from the semiconductor laser 9. The detection output of light receiving element PD is supplied to laser controller 14. A laser beam irradiated from semiconductor laser 9 is guided onto a recording surface of optical disk 1 through collimator lens 11a, beam splitter 11b and objective lens 6. A light beam reflected from the recording surface of disk 1 is guided through objective lens 6 and beam splitter 11b to half prism 11c which in turn breaks up the reflection light into two components. One of the components is supplied through focussing lens 10 to photosensor 8 to be converted into electric signals. The other component is supplied to photosensor 7 through focussing lens 11d.

Photosensor 8 receives the first component of the reflection beam and produce two electric signals, which are supplied to an operational amplifier OP1. This operational amplifier OP1 subtracts one of the two electric signals from the other to generate a tracking error signal. This tracking error signal is supplied to a tracking controller 16. This tracking controller 16 sends a tracking control signal to drive coil 4 through an amplifier 27, thereby driving the drive coil 4 to execute tracking servo control. This tracking control signal is also supplied to linear motor controller 17.

Photosensor 7 receives the second component of the reflection beam and produce two electric signals representing the positions where a laser beam is focused. These signals are supplied to an operational amplifier OP2, which subtracts one of the received signal from the other to generate a focussing error signal. This focussing error signal is supplied to a focussing controller 15. This focussing controller 15 supplies a voltage corresponding to the focussing error signal to drive coil 5 through an amplifier 28. In accordance with this voltage, drive coil 5 focuses a laser beam onto the recording surface of optical disk 1.

The two signals from photosensors 8 are also supplied to a video circuit 19 as signals reproduced from the recording surface of optical disk 1. This video circuit 19 reproduces image data, which is sent to interface 29.

The aforementioned laser controller 14, focussing controller 15, tracking controller 16, linear motor controller 17, and motor controller 18 are all coupled through a bus line 20 to a CPU 23 and controlled by the CPU 23. This CPU 23 executes a program stored in a memory 24, in response to a command entered through an operating panel 30.

An A/D converter 21 is coupled between focussing controller 15 and bus line 20, and D/A converter 22 is coupled to the bus line 20. A/D converter 21 is provided to permit data exchange between focussing controller 15 and CPU 23. D/A converter 22 is provided to permit data exchange among tracking controller 16, linear motor controller 17 and CPU 23.

FIG. 2 illustrates laser controller 14 of this invention. Laser controller 14 is coupled to light receiving element PD as well as to semiconductor laser 9. Light receiving element PD has its cathode coupled to a power source (not shown) and its anode coupled to an inverted input terminal of an operational amplifier IC1. The non-inverted input terminal of operational amplifier IC1 is grounded.

Operational amplifier IC1 has its output terminal (node c) coupled to its inverted input terminal through a variable resistor (first adjusting device) $R_f$ that adjusts a light current of the aforementioned light receiving element PD and also coupled to a fixed contact S21 of a switching circuit IC2 as a selector that is controlled by CPU 23. This switching circuit IC2 further has a fixed contact S22 ground through a power source $-E_{S1}$, and has a movable contact S23 coupled to an inverted input terminal of an operational amplifier IC3 through a resistor R1. This movable contact S23 is coupled through resistors R1 and R2 to the minus side of a power source $-E_{S2}$ (second adjusting device) which can vary a voltage. This power source $-E_{S2}$, whose positive side is grounded, adjusts the threshold value of light irradiated from semiconductor laser 9.

The aforementioned operational amplifier IC3 has its non-inverted input terminal grounded and its output terminal (node b) coupled to its inverted input terminal through R3. This output terminal is further coupled to a fixed contact S41 of a switching circuit IC4 which is used for ON/OFF control of laser light emitted in accordance with a recording signal from CPU 23 corresponding to record data. Switching circuit IC4 has another fixed contact S42 grounded and a movable contact S43 coupled through a resistor R4 to an inverted input terminal of operational amplifier IC5. This operational amplifier IC5 has its non-inverted input terminal grounded and its output terminal coupled to the base of a transistor TR. Transistor TR has its emitter coupled through a resistor R5 to the inverted input terminal of operational amplifier IC5 and ground through a resistor R9. The collector of transistor TR is coupled to the cathode of semiconductor laser 9 whose anode is coupled to a power source Vcc.

A node a between movable contact S23 of switching circuit IC2 and resistor R1 is coupled to inverted input terminals of operational amplifiers IC6 and IC7. The non-inverted input terminal is coupled to the node between the first two of resistors R6, R7 and R8 which are coupled in series between a power source $V_{EE}$ and the ground. The non-inverted input terminal of operational amplifier IC7 is coupled to the node between resistors R7 and R8. Reference voltages for operational amplifiers IC6 and IC7 are set respectively by these resistors R6 to R8. In accordance with the reference voltages, operational amplifiers IC6 and IC7 respectively send out an alarm signal and a ready signal respectively to CPU 23. Upon reception of the alarm signal, CPU 23 throws movable contact S43 to S42 to stop light emission in order to prevent the recording film of optical disk 1 from being damaged. Upon reception of the ready signal, CPU 23 sends a predetermined signal to laser controller 14 to drive semiconductor laser 9, thereby ensuring data recording by the laser 9.

The operation of the above-described laser controller will be described below. As shown in FIG. 2, normally, movable contact S23 of switching circuit IC2 is coupled to fixed contact S21 under the control of CPU 23 and movable contact S43 of switching circuit IC4 is coupled to fixed contact S41 in accordance with, for example, a recording signal corresponding to record data under the control of CPU 23. Consequently, transistor TR is turned on and semiconductor laser 9 emits light of a predetermined level.

The laser light from semiconductor laser 9 is irradiated on optical disk 1 for recording or reproducing record data thereon and is detected by light receiving element PD.

More specifically, when light is emitted from semiconductor laser 9, a light current flows through light receiving element PD in accordance with the amount of the light. With this light current denoted by $i_M$, a voltage of $-I_M R_f$ appears at the node a between movable contact S23 of switching circuit IC2 and resistor R1. Therefore, the voltage at node b between the output terminal of operational amplifier IC3 and fixed contact S41 of switching circuit IC4 is:

$$I_M R_f - (-E_{S2}) = I_M R_f + E_{S2}.$$

Accordingly, a laser current $i_L$ corresponding to this voltage $I_M R_f + E_{S2}$ flows through semiconductor laser 9, thereby causing the laser 9 to emit light.

When the amount of light from semiconductor laser 9 decreases due to a change in characteristic, etc., the light current $i_M$ flowing through light receiving element PD decreases. This drops the voltage ($I_M R_f + E_{S2}$) at node b. In this case, operational amplifier IC5 is an inverter amplifier, so that the laser current $i_L$ flowing through semiconductor laser 9 increases and the amount of light from the laser 9 increases as a consequence.

On the other hand, when the amount of light from semiconductor laser 9 increases, the light current $i_M$ also increases, thus increasing the voltage ($I_M R_f + E_{S2}$) at node b. This reduces the laser current $i_L$ to thereby reduce the amount of light from semiconductor laser 9.

As should be understood from the above, in accordance with the output of light receiving element PD, laser controller 14 performs a feedback control such that when the amount of light from semiconductor laser 9 decreases, laser controller 14 increases it and when the the amount of laser light increases, controller 14 decreases it, thereby maintaining the amount of light from semiconductor laser 9 constant.

A description is now given of how to adjust the amount of light from semiconductor laser 9. Assume that movable contact S23 of switching circuit IC2 is coupled to fixed contact S22 (i.e., the potential at node a being $-E_{S1}$) and movable contact S43 of switching circuit IC4 is coupled to S41 both under the control of CPU 23. Thus, the variable resistor $R_f$ (first adjusting device) is separated from the power source $-E_{S2}$ (second adjusting device). In this state, power source $-E_{S2}$ is adjusted to permit semiconductor laser 9 to emit a specified amount of light, thereby adjusting the threshold value of light emitted from semiconductor laser 9.

Under the same switching condition, variable resistor $R_f$ is adjusted so that the voltage at node c between the output terminal of operational amplifier IC1 and fixed contact S21 of switching circuit IC2 becomes equal to the voltage of power source $-E_{S1}$ (a pseudo monitoring signal for generating a signal for monitoring the amount of laser light). Consequently, the light current of light receiving element PD is adjusted.

After the above adjustments are executed, movable contact S23 of switching circuit IC2 is thrown to fixed contact S21 under the control of CPU 23. This sets the voltage at node a to $-E_{S1}$ so that semiconductor laser 9 emits the specified amount of light.

FIG. 3 illustrates the essential section of the circuit shown in FIG. 2. Referring to this diagram, the above-described light adjusting method will be now described in more detail. As should be obvious from the circuit diagram of FIG. 3, a current $i_L$ flowing across a laser diode LD is represented by $i_L = \dot{A}2(\dot{A}1 i_P + i)$ where $\dot{A}1$ and $\dot{A}2$ are the gains of the respective amplifiers A1 and A2, $i_P$ the output current of a photodiode PD, and i the current determined by a variable resistor VR1 for setting the output of the circuit. Let us assume that the gains $\dot{A}1$ and $\dot{A}2$ of amplifiers A1 and A2 are fixed. It is known that, as shown in FIGS. 4A and 4B, there are variations in $i_L$-L (amount of laser light) characteristic of laser diode LD and L-$i_P$ characteristic of photodiode PD. In order to render the input current $i_L$ constant, therefore, VR1 needs to be variable to thereby change the current i. The mentioned variations in two characteristics, however, change $i_P$, thereby varying the voltage $\dot{A}1 i_P$ at an abnormality-monitored point.

This problem can be solved by rendering the gain $\dot{A}1$ of amplifier A1 variable so that if $i_p$ increases, the gain $\dot{A}1$ of amplifier A1 is reduced to make voltage $\dot{A}1 i_P$ constant. This will be explained below referring to the flowchart of FIG. 5. First, a switch SW1 is switched to the E2 side (step S1). Then, i is varied by means of VR1 to adjust $i_L$ in such a way that the amount of laser light becomes the required level (step S2). In this case, the current $i_L$ is represented as $i_L = \dot{A}2(i2+i)$ where i2 is the output current of E2. Obviously, $i_L$ does not depend on $i_p$ and is not influenced by it. Accordingly, the $i_L$-L (amount of laser light) characteristic of laser diode LD has only to be considered in order to determine $i_L$ for adjustment of the amount of the laser light.

Since, at this time, the laser is emitting light, current $i_p$ is generated photodiode PD. Now the gain $\dot{A}1$ is varied to render the current $\dot{A}1 i_P$ at the abnormality-monitored point to be $\dot{A}1 i_P = i2$ (step S3). Then, switch SW1 is switched to the A1 side (step S4). Accordingly, $i_L = \dot{A}2(\dot{A}1 \cdot i_P + i) = \dot{A}2(i2+i)$ is satisfied, so that the necessary current $i_L$ can be attained by throwing switch SW1 to either side. Further, since $\dot{A}1 i_P = i2$, the current i2 flows through the abnormality-monitored point. In practice, and I/V converter and a V/I converter are provided at the input and output stages of the aforementioned essential section, respectively, and signal processing in this section is executed in terms of voltage.

A description is now given of the monitoring of an abnormal state of emitted laser light. Assuming that the gain $\dot{A}1$ of amplifier A1 is fixed and there exists a current $i_{P1}$ satisfying $i_P > i_{P1}$, then, there exists a current i1 that satisfies $i_L = \dot{A}2(\dot{A}1 i_{P1} + i1)$. Therefore, $i1 > i$, and the voltage value at the abnormality-monitored point increases so that an alarm signal would be generated even though the amount of laser light were proper. Similarly, for $i_P < i_{P2}$, $i_L = \dot{A}2(\dot{A}1 + i2)$. Therefore, $i2 < i$ and the voltage value at the abnormality-monitored point decreases. Consequently, no ready signal would be generated even though the amount of the laser light were proper. Now, gains $\dot{A}11$ and $\dot{A}12$ of a1 are so set as to satisfy $\dot{A}11 i_{P1} = \dot{A}12 i_{P2} = \dot{A}1 i_P = i2$ where the gain $\dot{A}1$ is taken to be variable. Then, $i_L = \dot{A}2(\dot{A}11 i_{P1} + i1') = \dot{A}2(\dot{A}12 i_{P2} + i2') = \dot{A}2(\dot{A}1 i_P + i)$, which leads to $i1' = i2' = i$. Therefore, the value at an abvormality-monitored point with respect to the proper amount of light is always constant, thus ensuring accurate abnormality detection.

As described above, by separately adjusting power source $-E_{S2}$ and variable resistor $R_f$, variations in threshold value of light from semiconductor laser 9 and light current of light receiving element PD (for each variation, the maximum level being three to five times greater than the minimum level) can independently be compensated. Accordingly, the output (voltage at node a) of light receiving element PD after the adjustments can be set to correctly correspond to the amount of light from semiconductor laser 9. Therefore, the detection accuracy of the ready signal and alarm signal is improved. For instance, the detection value of the ready signal can be improved to about 80% of the normal value and the detection value of the alarm signal to about 150% of the normal value. This improves the reliability of the ready and alarm signals, so that a possible damage of the recording film (not shown) of optical disk 1 due to various problems originating from abnormal light emission from semiconductor laser 9, for example, irradiation of excess laser output, can be avoided.

Needless to say, this invention is in no way limited to the above particular embodiment, but can be modified in various manners within the scope and spirit of the invention.

What is claimed is:

1. An apparatus for adjusting an amount of laser light comprising:
   means for generating laser light;
   means for energizing said laser light generating means;
   means for detecting an amount of the generated laser light and producing an output signal having an amplitude corresponding to the amount of the generated laser light;
   first adjusting means coupled to said detecting means for adjusting the amplitude of the output signal to a predetermined value;
   second adjusting means coupled to said energizing means for adjusting the output of said energizing means to control the amount of the generated laser light to a predetermined value; and
   means coupled to the first and second adjusting means for performing separately the adjustment of the amplitude of the generated output signal and the control of the amount of the generated laser light.

2. The apparatus according to claim 1, wherein said energizing means includes a variable direct current (DC) power source responsive to said performing means for generating a variable DC voltage supplied to said laser light generating means.

3. The apparatus according to claim 1, wherein said first adjusting means includes an amplifier for amplifying the output signal, means for varying the gain of the amplifier, and means for generating a pseudo-output signal corresponding to the output signal of the detecting means.

4. The apparatus according to claim 3, wherein said gain varying means includes a variable resistor for varying a resistance value.

5. The apparatus according to claim 1, further comprising means for generating an alarm signal indicating that the output signal generated by the detecting means is at an excess level.

6. An apparatus for recording data by irradiating light on a recording medium, comprising:
   means for generating laser light;
   means for energizing said laser light generating means;
   means for detecting an amount of the generated laser light and producing an output signal having an amplitude corresponding to the amount of the generated laser light;
   first adjusting means coupled to said detecting means for adjusting the amplitude of the output signal to a predetermined value;
   second adjusting means coupled to said energizing means for adjusting the output of said energizing means to control the amount of the generated laser light to a predetermined value;
   means coupled to the first adjusting means and the second adjusting means for performing separately the adjustment of the amplitude of the output signal and the control of the amount of the generated laser light; and
   means for directing the generated laser light onto the recording medium to record data thereon in accordance with amount of the generated laser light.

7. The apparatus according to claim 6, wherein said energizing means includes a variable direct current (DC) power source responsive to the performing means for generating a variable DC voltage supplied to said generating means.

8. The apparatus according to claim 6, wherein said first adjusting means includes an amplifier for amplifying the output signal, means for varying the gain of the amplifier, and means for generating a pseudo output signal corresponding to the generated output signal.

9. The apparatus according to claim 8, wherein said gain varying means includes a variable resistor for varying a resistance value.

10. The apparatus according to claim 6, further comprising means for generating an alarm signal indicating that the output signal generated by the detecting means is at an excess level.

11. A method of adjusting an amount of laser light, comprising the steps of:
    generating laser light;
    detecting an amount of the generated laser light and producing an output signal having an amplitude corresponding to the amount of the generated laser light;
    adjusting the amplitude of the generated output signal to a predetermined value;
    adjusting the amount of the generated laser light to a predetermined value; and
    performing separately the adjusting steps.

12. The method according to claim 11, wherein the generating step includes supplying a direct-current voltage to a laser medium and the step of adjusting the amount of the generated laser light includes the substep of varying said DC voltage.

13. The method according to claim 11, wherein said step of adjusting the amplitude of the output signal includes the substep of amplifying the output signal to provide a pseudo-output signal corresponding to the generated output signal.

14. The method according to claim 13, wherein said substep of amplifying includes the substep of varying a resistance value of a variable resistor.

15. The method according to claim 11, further comprising the step of generating an alarm signal indicating that the output signal generated by the light detector is at an excess level.

* * * * *